United States Patent [19]
Hoshizaki et al.

[11] Patent Number: 5,243,572
[45] Date of Patent: Sep. 7, 1993

[54] DESELECT CIRCUIT

[75] Inventors: Gary W. Hoshizaki, Mesa; Robert A. Fuller, Gilbert; Ray A. Gomez, Chandler, all of Ariz.

[73] Assignee: Motorola, Inc., Schaumburg, Ill.

[21] Appl. No.: 820,824

[22] Filed: Jan. 15, 1992

[51] Int. Cl.$^5$ .......................... G11C 7/00; G11C 8/00
[52] U.S. Cl. .................................. 365/203; 365/204; 365/230.03; 365/233
[58] Field of Search ............. 365/203, 204, 233, 230.03

[56] References Cited

U.S. PATENT DOCUMENTS

| | | | |
|---|---|---|---|
| 4,636,991 | 1/1987 | Flannagan et al. | 365/203 |
| 4,658,381 | 4/1987 | Reed et al. | 365/203 |
| 4,661,931 | 4/1987 | Flannagan et al. | 365/203 |
| 4,698,788 | 10/1987 | Flannagan et al. | 365/203 |
| 4,757,215 | 7/1988 | Seo | 365/203 |
| 4,794,570 | 12/1988 | Rose et al. | 365/203 |
| 4,881,203 | 11/1989 | Watanabe et al. | 365/203 |
| 4,984,201 | 1/1991 | Sato et al. | 365/203 |
| 4,984,204 | 1/1991 | Sato et al. | 365/203 |
| 5,153,459 | 10/1992 | Park et al. | 365/205 |

Primary Examiner—Eugene R. LaRoche
Assistant Examiner—Christopher R. Glembocki
Attorney, Agent, or Firm—Joe E. Barbee

[57] ABSTRACT

A deselect circuit (10) receiving a variable number of input signals which enables an output stage to generate a logic state signifying a deselect condition at a deselect output (12). The deselect circuit (10) operates synchronously having a clock signal (21) and inverted clock signal (22) to control internal timings. The deselect output (12) is preset to a logic state signifying a select condition prior to starting a deselect sequence, thus eliminating the need for circuitry to generate the select condition. The path for generating a deselect condition comprises a transmission gate which couples the inverted clock signal to a driver stage, a multiple input switch which couples the driver stage to a output stage, and the output stage which generates a logic state signifying a deselect condition at the deselect output (12). A sensing circuit is used to sense the select condition and enable a second driver stage to maintain the select condition.

15 Claims, 3 Drawing Sheets

DESELECT CIRCUIT

BACKGROUND OF THE INVENTION

This invention relates, in general, to decoding circuits, and more particularly to a block deselect circuit used in block architected static random access memories (SRAMs) built for compiler applications.

A SRAM compiler is a computer program which can synthesize different configurations of memory (variable wordwidth and number of words in the memory) for a SRAM. A SRAM compiler program creates a netlist of the memory, simulates the worst case delay path through the memory to generate timing information, builds a symbol of the SRAM for placement in a schematic, builds a simulation model with the timing information, creates a physical layout of the SRAM, builds a routing abstraction of the SRAM, and creates a power grid structure for the SRAM. The SRAM compiler is used to generate memories for application specific integrated circuits (ASICs), wherein the SRAM is only one component of many used in the design of the integrated circuit.

Initial attempts at building compilable decode stages focused on the extremely fast NAND and NOR decode stages used on full custom SRAMs for the consumer market. Although fast, the NAND and NOR decode stages proved cumbersome when implemented in a compiler for synthesizing random SRAM configurations. The computer code necessary to write the synthesis programs proved to be extremely complex, resource intensive, and take considerable development time. The standard approach was abandoned for new approaches developed to simplify building a compiler based memory.

First generation SRAM compilers and more specifically the decode stages, were designed to simplify the synthesis of the decode stage and the construction of the physical layout. The SRAM compilers were designed having a single block of memory which is not optimal for large memory size performance. Although compilers are capable of synthesizing a SRAM for most applications it has become evident that users expect performance levels and SRAM densities equivalent to what is offered in the full custom SRAM market place. Most compiled SRAMs are much slower than full custom designs due to the compromises in building a configurable circuit.

One method for enhancing the speed of the SRAM is to divide a large single block of memory into smaller individual blocks of memory. How the memory is accessed depends on the decoding scheme. Each block of memory can be accessed separately or multiple blocks can be accessed simultaneously. An additional stage of decoding must be added to the SRAM to access the individual memory blocks, but performance is gained by reducing parasitic capacitance and resistance associated with the memory block due to the smaller memory block size, thereby increasing speeds of the circuits which drive the smaller loads. This is known as a block architected SRAM. Adding the extra circuitry needed to form the block architected SRAM increases the complexity of a compiler program. There is a need for a decode circuit which simplifies compilability yet is compatible with a block architected SRAM design, and has performance similar to full custom block architected SRAM designs.

SUMMARY OF THE INVENTION

Briefly stated, the present invention is achieved by a deselect output which is precharged during the intialization cycle to a logic state signifying a select condition. The high phase of the clock signal initiates a deselect sequence. The clock signal is coupled through a transmission gate to a driver stage. A multiple input switch couples the driver stage to an output stage. Any input signal in an enabling logic state received by the multiple input switch can couple the driver stage to the output stage, thereby generating a deselect condition at the deselect output. If all input signals received by the multiple input switch are in a disabling logic state the driver stage is not coupled to the output stage thereby allowing the deselect output to remain in the select condition. The multiple input switch comprises a plurality of n-channel enhancement MOSFETs in parallel, each gate receiving an input signal. The output stage is capacitively loaded by a plurality of row/block decode circuits specific to a memory block. The output stage is capable of rapidly discharging this capacitive load.

After the deselect condition has been generated during the deselect sequence, the transmission gate decouples the clock signal from the driver stage. A disabling circuit disables the driver stage and the output stage thereby allowing internal nodes to be reinitialized after the deselect sequence is finished.

If the select condition remains at the deselect output during a select condition, a sensing circuit monitors this condition and enables a second driver stage coupled to the deselect output to maintain the select condition. The sensing circuit enables the second driver stage after the deselect circuit has had enough time to generate a deselect condition, thereby, eliminating a contention condition between the output stage and the second driver stage.

DETAILED DESCRIPTION OF THE DRAWINGS

Figure 1:
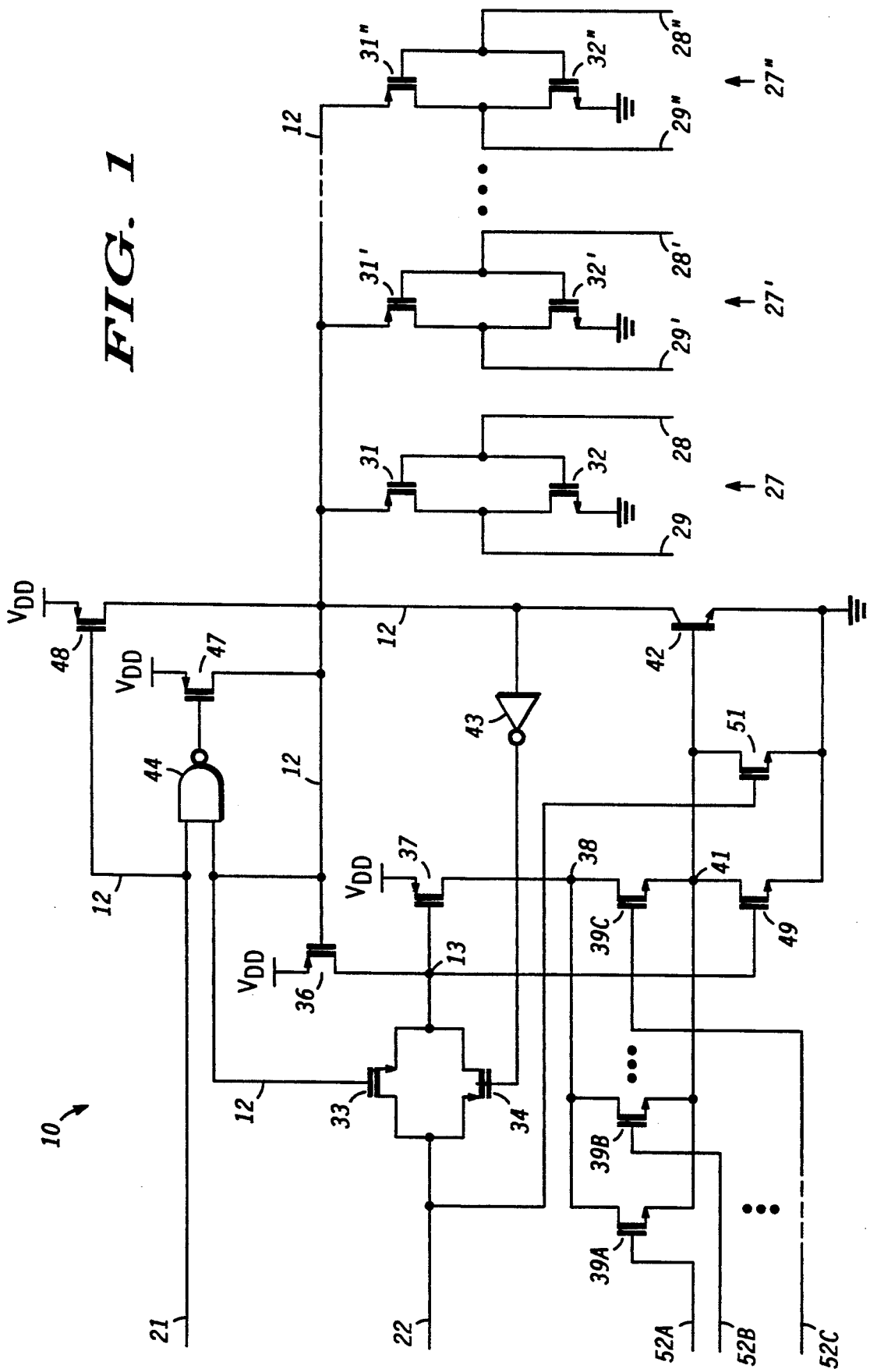
FIG. 1 is a circuit schematic in accordance with an embodiment of the present invention.

FIG. 1 illustrates a preferred embodiment of deselect circuit 10. A plurality of deselect circuits 10 are used in a block architected SRAM. A block architected SRAM has a plurality of memory blocks, each memory block having a plurality of memory cell rows. Each deselect circuit 10 corresponds to a predetermined memory block. Deselect circuit 10 generates an enable or disable signal for the predetermined memory block thereby activating or deactivating a plurality of row/block decode circuits 27, 27', and 27" corresponding to each memory cell row. A specific memory cell row in the predetermined memory block is enabled when the row/block decode circuit 27, 27', or 27" corresponding to the specific memory cell row receives a row decode enable signal and the block deselect enable signal.

Inverted clock signal 22 and clock signal 21 break deselect circuit 10 operation into two separate cycles. The low phase of clock signal 21 is an initialization cycle where internal nodes of deselect circuit 10 are preset to predetermined voltages. Deselect output 12 is initialized to a one logic state signifying a select condition prior to the high phase of clock signal 21. The high phase of clock signal 21 initiates a deselect sequence. In the preferred embodiment, inverted clock signal 22 leads clock signal 21 to minimize delay in generating a zero logic state at deselect output 12, signifying a deselect condition.

A transmission gate is formed by a p-channel enhancement MOSFET 34 and a n-channel enhancement MOSFET 33. MOSFET 34 has a gate receiving an inverted deselect output signal from inverter 43, a drain coupled to node 13, and a source receiving inverted clock signal 22. N-channel enhancement MOSFET 33 has a gate coupled to deselect output 12, a drain receiving inverted clock signal 22, and a source coupled to node 13. The transmission gate is enabled when deselect output 12 is in a one logic state which signifies the select condition; thus the transmission gate serves as a means for coupling which couples inverted clock signal 22 to node 13.

P-channel enhancement MOSFET 37 has a gate coupled to node 13, a drain coupled to node 38, and a source coupled to a voltage terminal Vdd, is enabled when node 13 is in a zero logic state; thus MOSFET 37 serves as a means for enabling an output stage comprising bipolar transistor 42.

A plurality of n-channel enhancement MOSFETs 39a, 39b, and 39c form a multiple input switch for coupling node 38 to node 41. N-channel enhancement MOSFETs 39a, 39b, and 39c have common drains, common sources, and gates 52a, 52b, and 52c for receiving predetermined input signals. The number of inputs to the multiple input switch can be increased or decreased by adding or subtracting n-channel enhancement MOSFETs to the switch. The multiple input switch will couple node 38 to node 41 if any of gates 52a, 52b, or 52c receives a predetermined input signal in a one logic state. Conversely, node 38 will be decoupled from node 41 if each gate 52a, 52b, and 52c receives a predetermined input signal in a zero logic state.

The predetermined input signals received by the multiple input switch forms a binary address. The number of different binary addresses which can be input to deselect circuit 10 is determined by the number of predetermined input signals Deselect circuit 10 receiving N predetermined input signals has $2^N$ possible binary address combinations. Only when all predetermined input signals are low (a binary address of zero) during the deselect sequence will the select condition remain at deselect output 12. Using this technique $2^N$ deselect circuits could be individually decoded in a block architected SRAM, each deselect circuit 10 having a unique predetermined address for generating a select condition. This is achieved by inverting the predetermined input signals corresponding to the unique predetermined address bits in a one logic state, thereby generating the binary address of zero when the unique predetermined address is input to deselect circuit 10. All other inputs (other than the unique predetermined address) will cause deselect circuit 10 to generate a deselect condition at deselect output 12.

The common connections between n-channel enhancement MOSFETs 39a, 39b, and 39c simplifies synthesis of the physical layout. The number of n-channel enhancement MOSFETs used in the variable input stage will vary depending on the SRAM architecture. Synthesis of the physical layout of the variable input stage can be made by replicating and abutting a single n-channel enhancement MOSFET layout. The MOSFET layout is replicated for the number of devices needed in the deselect circuit and abutted one to another forming a parallel chain of devices. Common connections are made by bringing points to be connected to the borders of the layout such that abutting the MOSFET layouts forms a continuous connection through the abutted layouts. Other contact points can be brought to the cell layout border for coupling to different layout cells.

Bipolar transistor 42 serves as an output stage having a base coupled to node 41, a collector coupled to deselect output 12, and an emitter coupled to ground provides current amplification for discharging a capacitive load on deselect output 12 thereby generating a zero logic state at deselect output 12 signifying a deselect condition.

The capacitive load on deselect output 12 comprises a plurality of row/block decode circuits 27, 27', and 27". Deselect circuit 10 enables or disables the plurality of row/block decoder circuits 27, 27', and 27". Each row/block decoder circuit 27, 27', and 27" enables a predetermined memory cell row. Row/block decode circuit 27 comprises a p-channel enhancement MOSFET having a gate coupled to row signal 28, a drain coupled to row/block decode output 29, and a source coupled to deselect output 12, and a n-channel enhancement MOSFET having a gate coupled to row signal 28, a drain coupled to row/block decode output 29, and a source coupled to ground. Row/block circuit 27 generates an enable signal at row/block decode output 29 when deselect output 12 is in a select condition and row/block decoder 27 receives row signal in a zero logic state. When enabled a row/block decoder circuit 27, 27', or 27" sinks current and is capable of discharging deselect output 12.

P-channel enhancement MOSFET 48 serves as a means for precharging and charges deselect output 12 to a one logic state when clock signal 21 is in a zero logic state (the initialization cycle) prior to starting a deselect sequence. The precharged one logic state at deselect output 12 signifies a select condition. Bipolar transistor 42 is disabled when p-channel enhancement MOSFET 48 is enabled to avoid a contention condition. P-channel enhancement MOSFET 48 has a gate coupled to clock signal 21, a drain coupled to deselect output 12, and a source coupled to voltage Vdd.

N-channel enhancement MOSFET 51 disables bipolar transistor 42 when inverted clock signal 22 is in a one logic state (the initialization cycle) by pulling node 41 to ground. N-channel enhancement MOSFET 51 has a gate coupled to inverted clock signal 22, a drain coupled to node 41, and a source coupled to ground.

P-channel enhancement MOSFET 36 serves as a means for disabling. P-channel enhancement MOSFET 37 is disabled by p-channel enhancement MOSFET 36 after bipolar transistor 42 discharges deselect output 12 to ground, and the means for coupling is disabled thereby removing current drive to the output stage. P-channel enhancement MOSFET 36 is enabled by the zero logic state at deselect output 12 and charges node 13 to a one logic state. P-channel enhancement MOSFET 36 has a gate coupled to deselect output 12, a drain coupled to node 13, and a source coupled to voltage terminal Vdd.

N-channel enhancement MOSFET 49 disables bipolar transistor 42 during the deselect sequence after p-channel enhancement MOSFET 36 charges node 13 to a one logic state. N-channel enhancement MOSFET 49 has a gate coupled to node 13, a drain coupled to node 41, and a source coupled to ground. N-channel enhancement MOSFET 49 is enabled by the one logic state on node 13 and discharges node 41 to ground.

NAND gate 44 serves as a means for sensing. NAND gate 44 is used to sense the state of clock signal 21 and deselect output 12 and provides a sense control signal. NAND gate 44 generates a zero logic state sense control signal when clock signal 21 is in a one logic state (signifying a deselect sequence) and deselect output 12 is in a one logic state (signifying a select condition). NAND gate 44 delays generation of the zero logic state sense control signal to allow time for bipolar transistor 42 to discharge deselect output 12 during the deselect sequence, thereby eliminating the generation of a false sense control signal.

P-channel enhancement MOSFET 47 serves as a means for charging and holds deselect output 12 at voltage Vdd when deselect output 12 is not discharged during the deselect sequence thereby holding deselect output 12 in the select condition. P-channel enhancement MOSFET 47 has a gate receiving the sense control signal, a drain coupled to deselect output 12, and a source coupled to voltage terminal Vdd.

Figure 2:
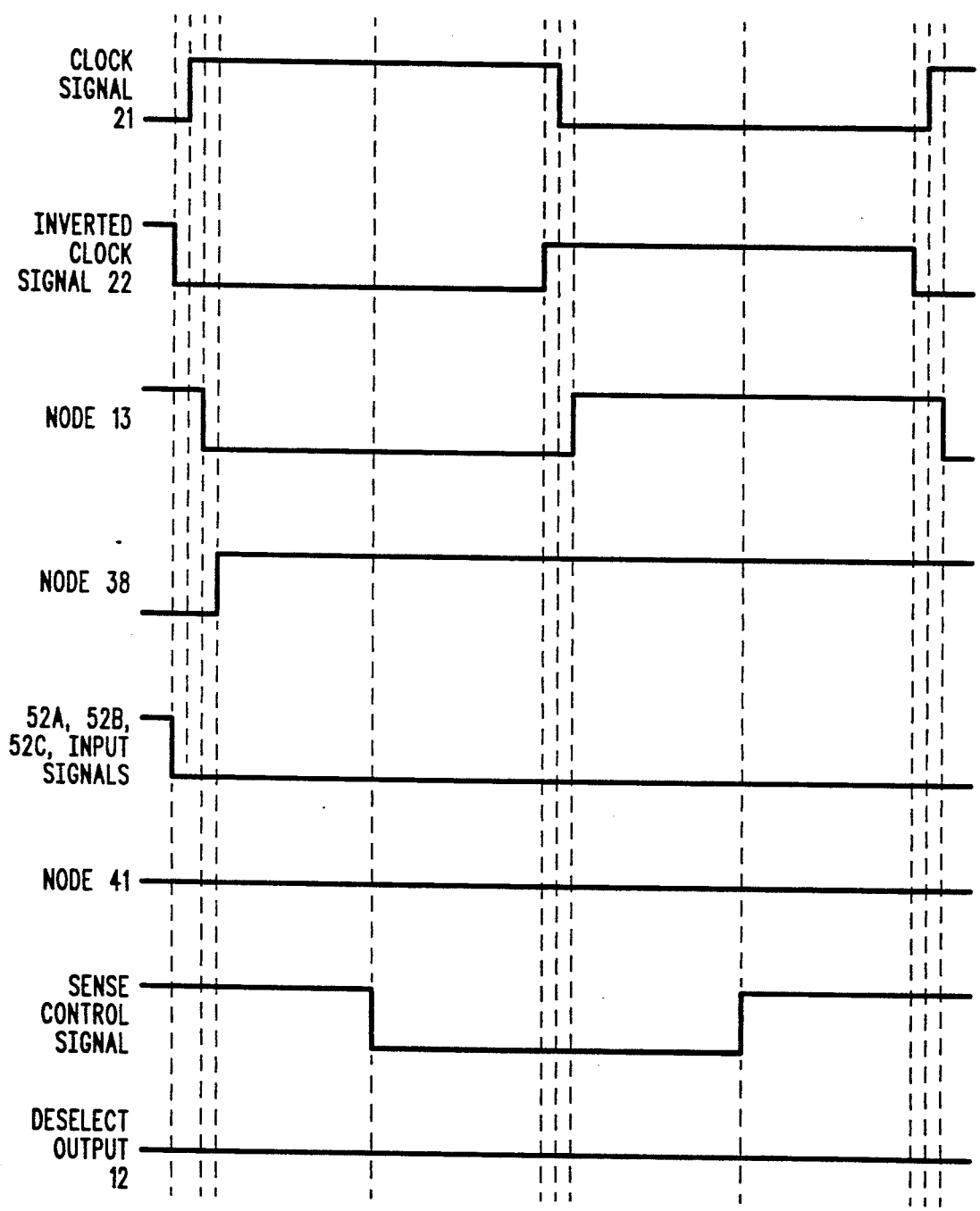
FIG. 2 is a timing diagram of the deselect circuit generating a select condition.

FIG. 2 illustrates a timing diagram of the deselect circuit of FIG. 1 generating a select condition at deselect output 12.

In the preferred embodiment, inverted clock signal 22 starts a deselect sequence by transitioning to a zero logic state. Clock signal 21 transitions to a one logic state one inverter delay after inverted clock signal 22 transitions. P-channel enhancement MOSFET 48 of FIG. 1 is disabled by clock signal 21 thereby floating deselect output 12 (no active circuitry is holding deselect output 12 in the one logic state). Starting the deselect circuit with inverted clock signal 22 minimizes delay through the deselect circuit for generating a deselect condition at deselect output 12.

Input signals 52a, 52b, and 52c all transition to a zero logic state prior to, or simultaneously with inverted clock signal 22. N-channel enhancement MOSFETs 39a, 39b, and 39c of FIG. 1 are disabled by receiving input signals 52a, 52b, and 52c in the zero logic state thereby decoupling node 38 from node 41.

The transmission gate formed by n-channel enhancement MOSFET 33 of FIG. 1 and p-channel enhancement MOSFET 34 of FIG. 1 is enabled (MOSFET 33 is enabled by deselect output 12 in a one logic state and MOSFET 34 is enabled by inverter 43) and couples inverted clock signal 22 to node 13 thereby discharging node 13 to ground. P-channel enhancement MOSFET 37 of FIG. 1 is enabled charging node 38 to one logic state.

Node 41 is decoupled from node 38 by N-channel enhancement MOSFETs 39a, 39b, and 39c and remains in a zero logic state. Node 41 in a zero logic state disables bipolar transistor 42 of FIG. 1 during the deselect sequence and deselect output 12 remains in a one logic state.

Sense control signal provided by NAND gate 44 of FIG. 1 transitions to a zero logic state a predetermined amount of time after clock signal 21 transitions to the one logic state and deselect output 12 remains in a one logic state. The sense control signal in a zero logic state enables p-channel enhancement MOSFET 47 of FIG. 1 to hold deselect output 12 at voltage Vdd.

Initialization occurs when inverted clock signal 22 transitions to a one logic state. Clock signal 21 transitions to a zero logic state one inverter delay after inverted clock signal 22 transitions.

The transmission gate formed by n-channel enhancement MOSFET 33 and p-channel enhancement MOSFET 34 remains enabled due to a one logic state at deselect output 12. Inverted clock signal 22 coupled to node 13 through the transmission gate charges node 13 to a one logic state.

P-channel enhancement MOSFET 37 is disabled by node 13 in a one logic state. After p-channel enhancement MOSFET 37 is disabled (removing drive for enabling bipolar transistor 42) n-channel enhancement MOSFETs 39a, 39b, and 39c can be enabled or disabled by input signals 52a, 52b, and 52c without affecting bipolar transistor 42.

Node 41 remains in a zero logic state held by n-channel enhancement MOSFETs 49 (enabled by node 13) and 51 (enabled by inverted clock signal 22) of FIG. 1. If any of n-channel enhancement MOSFETs 39a, 39b, or 39c are enabled during initialization node 38 will be discharged to ground.

Sense control signal transitions to a one logic state a predetermined time after clock signal 21 transitions to a zero logic state. Sense control signal in a one logic state disables p-channel enhancement MOSFET 47 from holding deselect output at voltage Vdd. P-channel enhancement MOSFET 48 is enabled by clock signal 21 in a zero logic state holding deselect output at voltage Vdd. All nodes in the deselect circuit are now in a fixed logic state and the deselect circuit can be activated for another deselect sequence.

Figure 3:
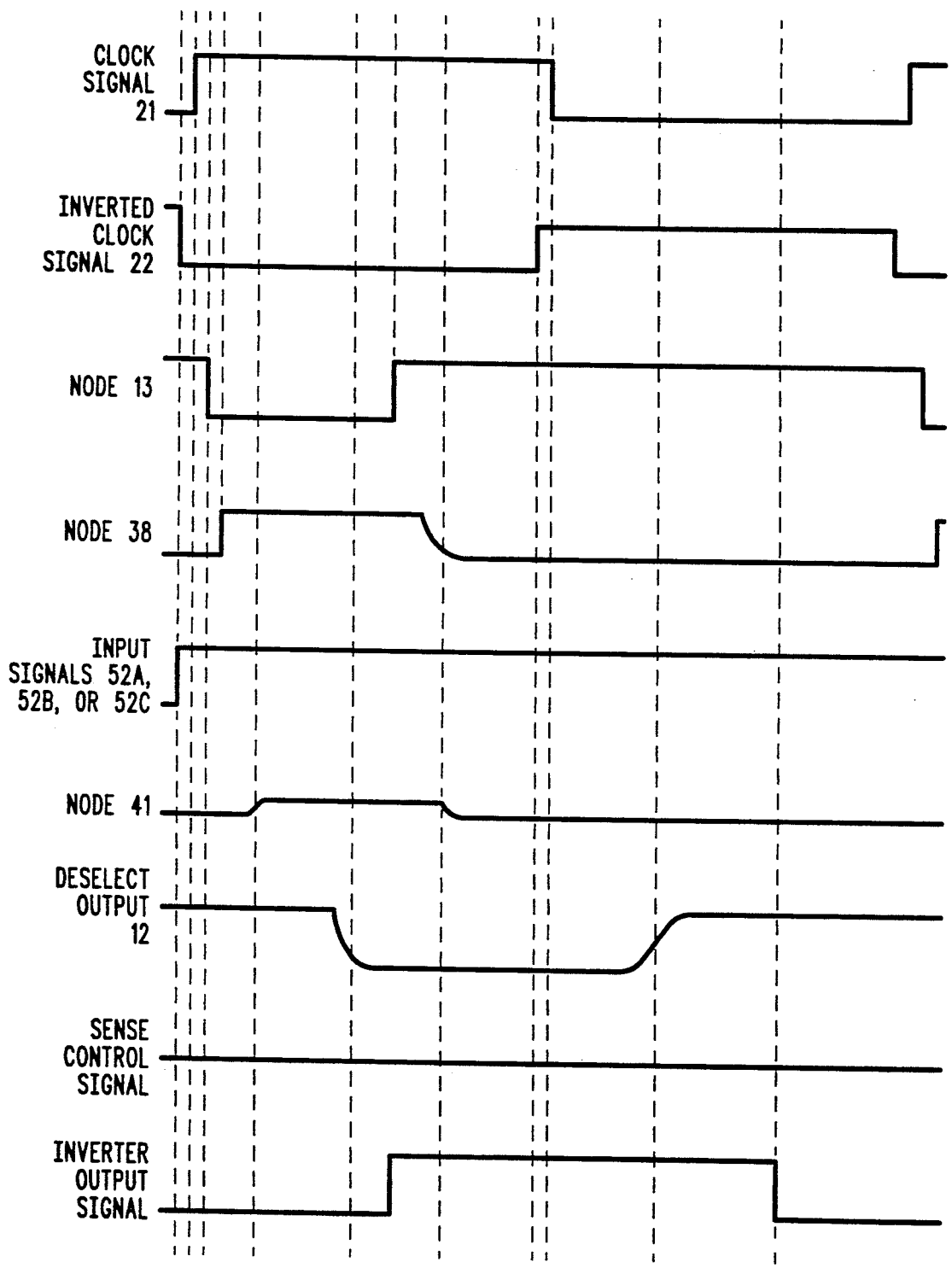
FIG. 3 is a timing diagram of the deselect circuit generating a deselect condition.

FIG. 3 illustrates a timing diagram of the deselect circuit of FIG. 1 generating a deselect condition at deselect output 12.

In the preferred embodiment, inverted clock signal 22 starts a deselect sequence by transitioning to a zero logic state. Clock signal 21 transitions to a one logic state one inverter delay after inverted clock signal 22 transitions. P-channel enhancement MOSFET 48 of FIG. 1 is disabled by clock signal 21 thereby floating deselect output 12 (no active circuitry is holding deselect output 12 in the one logic state).

Any input signal 52a, 52b, or 52c transitioning to a one logic state prior to, or simultaneously with inverted clock signal 22 transitioning to a zero logic state enables a corresponding n-channel enhancement MOSFET 39a, 39b, or 39c of FIG. 1, thereby coupling node 38 to node 41.

The transmission gate formed by n-channel enhancement MOSFET 33 of FIG. 1 and p-channel enhancement MOSFET 34 of FIG. 1 is enabled (MOSFET 33 is enabled by deselect output 12 in a one logic state and MOSFET 34 is enabled by inverter 43) and couples inverted clock signal 22 to node 13 thereby discharging node 13 to ground. P-channel enhancement MOSFET 37 of FIG. 1 is enabled charging node 38 to a one logic state.

P-channel enhancement MOSFET 37 charges node 41 through n-channel enhancement MOSFET 39a, 39b, or 39c (at least one is enabled). As the voltage on node 41 rises the base emitter junction of bipolar transistor 42 (FIG. 1) is forward biased. Bipolar transistor 42 rapidly discharges deselect output 12 and starts to saturate as deselect output 12 approaches ground. Deselect output 12 is in a zero logic state signifying a deselect condition.

Deselect output 12 at a zero logic state (ground) forces the sense control signal at the output of NAND gate 44 of FIG. 1 to remain in a one logic state. P-channel enhancement MOSFET 47 of FIG. 1 remains disabled by the sense control signal.

The transmission gate formed by n-channel enhancement MOSFET 33 and p-channel enhancement MOSFET 34 is disabled by the zero logic state at deselect output 12 and decouples inverted clock signal 22 from node 13.

P-channel enhancement MOSFET 36 of FIG. 1 is enabled by deselect output transitioning to ground. P-channel enhancement MOSFET 36 charges node 13 to a one logic state disabling p-channel enhancement MOSFET 37 from supplying base current to bipolar transistor 42 and enabling n-channel enhancement MOSFET 49 of FIG. 1 for discharging node 41 to ground. Node 41 transitioning to ground disables bipolar transistor 42.

Initialization occurs when inverted clock signal 22 transitions to a one logic state. Clock signal 21 transitions to a zero logic state one inverter delay after inverted clock signal 22 transitions.

Sense control signal from NAND gate 44 remains in a one logic state due to clock signal 21 transitioning to the zero logic state. P-channel enhancement MOSFET 47 remains disabled by the one logic state of the sense control signal from the output of NAND gate 44.

P-channel enhancement MOSFET 48 is enabled by clock signal 21 in a zero logic state and charges deselect output 12 to a one logic state.

P-channel enhancement MOSFET 36 is disabled by deselect output 12 charged to a one logic state.

The transmission gate formed by n-channel enhancement MOSFET 33 and p-channel enhancement MOSFET 34 is enabled as deselect output 12 transitions to a one logic state (MOSFET 33 is enabled by deselect output 12 in a one logic state and MOSFET 34 is enabled by inverter 43) and couples inverted clock signal 22 to node 13 thereby holding node 13 at the one logic state.

P-channel enhancement MOSFET 37 remains disabled by node 13 in a one logic state. N-channel enhancement MOSFET 51 is enabled by inverted clock signal 22 in a one logic state and n-channel enhancement MOSFET 49 remains enabled by node 13 (holding node 41 to ground). If any of n-channel enhancement MOSFETs 39a, 39b, or 39c are enabled, node 38 will be discharged to ground through n-channel enhancement MOSFETs 39a, 39b, or 39c (whichever is enabled) and n-channel enhancement MOSFETs 49 and 51.

Node 41 remaining in a zero logic state keeps bipolar transistor 42 disabled.

By now it should be appreciated that there has been provided a deselect circuit 10. The deselect circuit 10 is easily adapted for use in a compiler for synthesizing different configurations of SRAMs. The deselect output 12 is precharged to a one logic state signifying a select condition prior to starting the deselect sequence. Since the select condition is preset, the deselect circuit is optimized for minimizing delay in generating a deselect condition (zero logic state). The deselect circuit disables the output stage if a deselect condition is generated and senses for a select condition to provide additional drive for preventing active circuitry from discharging the deselect output 12.

I claim:

1. A block deselect circuit for disabling a plurality of row/block decoder circuits in a memory block of a compiled block architected SRAM comprising:
   a transmission gate receives an inverted clock signal and couples to a block deselect output for enabling or disabling the transmission gate, and provides a transmission gate output, when disabled the transmission gate decouples the inverted clock signal from the transmission gate output;
   a first p-channel enhancement MOSFET has a gate coupled to the transmission gate output, has a source coupled to a power supply terminal, and provides a base drive output for enabling an output stage;
   an input stage receiving a plurality of input signals for enabling the input stage, the input stage couples to the base drive output and provides an input stage output, the input stage couples the base drive output to the output stage when enabled by an input signal;
   the output stage for discharging a capacitive load formed by a plurality of row/block decoder circuits, couples to the input stage output and provides the block deselect output coupled to the capacitive load;
   a second p-channel enhancement MOSFET for precharging the block deselect output to a one logic state prior to starting a deselect sequence, and having a gate coupled to a clock signal, a source coupled to the power supply terminal, and a drain coupled to the block deselect output;
   a NAND gate for sensing logic states of the block deselect output and the clock signal and providing a NAND gate output;
   a third p-channel enhancement MOSFET having a gate coupled to the NAND gate output signal, a source coupled to the power supply terminal, and a drain coupled to the block deselect output, the third p-channel enhancement MOSFET minimizes voltage droop on the block deselect output when the block deselect output is not discharged during the decode sequence,.for all other clock signal and block deselect output conditions the third p-channel enhancement MOSFET is disabled by the NAND gate;
   a fourth p-channel enhancement MOSFET having a gate coupled to the block deselect output, a source coupled to the power supply terminal, and a drain coupled to the transmission gate output, the fourth p-channel enhancement MOSFET driving the transmission gate output to the power supply voltage when the block deselect output transitions to a zero logic state for disabling the base drive output; and
   a first n-channel enhancement MOSFET having a gate coupled to the inverted clock signal, a source coupled to ground, and a drain coupled to the base drive output, the n-channel enhancement MOSFET intializing the input stage output to ground when the inverted clock signal is in a one logic state.

2. The block deselect circuit of claim 1, wherein the input stage comprises a plurality of n-channel enhancement MOSFETs having common drains, having common sources, and having gates coupled for receiving the input signals, each of the plurality of n-channel enhancement MOSFETs when enabled forms a conductive path from the base drive output to the output stage, when all input signals are in a zero logic state all of the plurality of n-channel enhancement MOSFETs are disabled thereby preventing the output stage from being enabled, all other input signal combinations will have at least one input signal in a one logic state which enables one of the plurality of n-channel enhancement MOSFET thereby coupling the base drive output to the output stage, the input stage having multiple inputs allows a decoding scheme to be employed in the block architected SRAM utilizing a plurality of block deselect circuits by connecting predetermined input signals to each block deselect circuit wherein the input signals needed to activate each block deselect circuit are specifically determined.

3. The block deselect circuit of claim 2, wherein the input stage physical layout can be synthesized for a predetermined number of the plurality of n-channel enhancement MOSFETs by replicating a layout of a single n-channel enhancement MOSFET and abutting the plurality of n-channel enhancement MOSFETs to form a row of n-channel enhancement MOSFETs having common drain connections by abutment, having common source connections by abutment, and having gate connections for receiving the input signals, connections between layouts are formed by extending paths to be connected to the layout border, when layouts are abutted together the two paths to be connected contact at the layout border forming a continuous path between the two layouts.

4. The block deselect circuit of claim 1, wherein the transmission gate comprises a second n-channel enhancement MOSFET and a fifth p-channel enhancement MOSFET for allowing the transmission gate output to follow the inverted clock signal from the power supply voltage to ground, the second n-channel enhancement MOSFET and the fifth p-channel enhancement MOSFET having common drains and common sources, the second n-channel enhancement MOSFET having a gate coupled to the block deselect output, the block deselect circuit further including an inverter receiving the block deselect output signal which has an inverted output coupled to the gate of the fifth p-channel enhancement MOSFET, the transmission gate is disabled when the block deselect output transitions from a one logic state to a zero logic state.

5. The block deselect circuit of claim 1, wherein the output stage comprises a bipolar npn transistor having a base coupled to the input stage output, an emitter coupled to ground, and a collector coupled to the block deselect output, the bipolar npn transistor providing current amplification for discharging the capacitive load on the block deselect output.

6. The block deselect circuit of claim 5, further including a second n-channel enhancement MOSFET having a gate coupled to the transmission gate output, a drain coupled to the base of the bipolar npn transistor, and a source coupled to ground, the second n-channel enhancement MOSFET is enabled when the block deselect output transitions from a one logic state to a zero logic state during a deselect sequence thereby pulling the base of the bipolar npn transistor to ground, thus disabling the bipolar npn transistor, once the bipolar npn transistor is disabled the block deselect output can be precharged to a one logic state upon finishing the deselect sequence.

7. The block deselect circuit of claim 1, wherein the NAND gate for sensing the block deselect output delays the transition from a one logic state to a zero logic state thereby allowing the block deselect output time to transition from a one logic state to a zero logic state before the NAND gate enables the third p-channel enhancement MOSFET having the gate receiving the NAND gate output signal, the drain coupled to the block deselect output, and the source coupled to the power supply terminal, this prevents a contention condition where the third p-channel enhancement MOSFET is enabled simultaneously with the bipolar npn transistor.

8. A multiple input deselect circuit receiving a plurality of input signals for enabling an output stage, a clock signal for starting a deselect sequence, and having a deselect output for discharging a capacitive load, the multiple input deselect circuit comprising:
  means for precharging the deselect output to a power supply voltage prior to starting the deselect sequence;
  means for enabling the output stage, having a control input and providing a driver output to activate the output stage, the control input disables or enables the driver output to activate the output stage;
  a multiple input switch for coupling the means for enabling to the output stage, the multiple input switch receiving a plurality of input signals, coupling to the driver output, and providing a switch output, any input signal in a one logic state enables the multiple input switch for coupling, all inputs in a zero logic state disables the multiple input switch from coupling the driver output to the output stage;
  the output stage having an input coupled to the switch output and coupling to the deselect output, the output stage discharges the capacitance load precharged to the power supply voltage during the deselect sequence;
  means for coupling receives the clock signal, couples to the deselect output, and provides a coupling output, the means for coupling provides the clock signal at the coupling output when enabled by a one logic state at the deselect output, the means for coupling decouples the clock signal from the coupling output when the deselect output is in a zero logic state which represents a deselect condition;
  means for disabling couples to the deselect output and provides a disable output for disabling the means for enabling, the means for disabling is activated when the deselect output is in a zero logic state thereby eliminating drive to the output stage;
  means for sensing receives the deselect output and receives the clock signal, and provides a sense control output based on the logic state of the deselect output and the clock signal; and
  means for charging coupling to the sense control output and having a charging output coupled to the deselect output for maintaining the precharged voltage on the deselect output when the output stage does not discharge the capacitance on the deselect output during the deselect sequence.

9. A method for building a multiple input deselect circuit which comprises:
  coupling a clock signal for starting a deselect sequence during a high phase of the clock signal and starting a reinitialization sequence during a low phase of the clock signal;
  precharging a deselect output to a predetermined voltage during the low phase of the clock signal with a precharge circuit;

coupling the clock signal internal to the multiple input deselect circuit through a transmission gate, the transmission gate is enabled or disabled by the deselect output, the transmission gate is enabled prior to starting a decode sequence;

enabling a driver stage for activating an output stage by an output from the transmission gate during the high phase of the clock signal;

using a multiple input switch having a plurality of inputs to couple the driver stage to the output stage, each input of the plurality of inputs can activate the multiple input switch for coupling;

receiving a plurality of input signals, each input signal of the plurality of input signals couples to an input of the multiple input switch, the input signals enable or disable the multiple input switch during the deselect sequence;

using the output stage for discharging a capacitive load on the deselect output, the output stage is enabled through the multiple input switch by the driver stage;

decoupling the driver stage from the clock signal by disabling the transmission gate when the output stage discharges the capacitive load on the deselect output;

disabling a driver disable circuit when the output stage discharges the capacitive load on the deselect output;

sensing the clock signal phase and the deselect output logic state with a sense circuit, the sense circuit generates an enable signal when the deselect output is in a one logic state and the clock signal is in a high phase; and holding the deselect output at the power supply voltage level when the deselect output remains in the precharged voltage state during the deselect sequence, wherein the holding is enabled by the sense circuit;

10. The method for building a multiple input deselect circuit of claim 9, further including:

receiving the plurality of input signals as binary signals, the binary signals forming a binary address, the input signals transition to a final logic state prior to starting the deselect sequence;

identifying a predetermined binary address for generating a logic state signifying a select condition at the deselect output during the deselect sequence, all other binary addresses generate a logic state signifying a deselect condition at the deselect output; and coupling modified input signals to the deselect circuit using complemented and non-complemented input signals wherein bits of the predetermined binary address in a one logic state are coupled to the deselect circuit through a complemented input signal thereby generating a binary address of all zeros to the deselect circuit when the predetermined binary address is input, all other modified input signal combinations have at least one modified input signal in a one logic state.

11. The method for building a multiple input deselect circuit of claim 9, further including:

delaying the time needed to generate an enable signal from the sense circuit, the enable signal transitioning after the maximum time needed for the deselect circuit to discharge the capacitive load on the deselect output during the deselect sequence thereby eliminating a condition where the output maintenance circuit is enabled simultaneously with the output stage.

12. The method for building a multiple input deselect circuit of claim 9, further including:

controlling the precharge circuit with the clock signal; and disabling the precharge circuit during the high phase of the clock signal.

13. The method for building a multiple input deselect circuit of claim 9, further including:

enabling the transmission gate with the deselect output in a one logic state;

disabling the driver disable circuit with the deselect output in a one logic state; and disabling the driver stage with the low phase of the clock signal coupled through the transmission gate, the deselect circuit being initialized for the deselect sequence during the high phase of the clock signal.

14. The method for building a multiple input deselect circuit of claim 13, further including:

delaying the clock signal through the transmission gate which allows the plurality of input signals received by the multiple input switch to transition to a final state at the start of the deselect sequence thereby eliminating an input signal setup time, the delayed clock signal activates the driver stage after the input signals have settled to a final logic state.

15. The method for building a multiple input deselect circuit of claim 9, further including:

sustaining the precharged output voltage at the deselect output, the deselect output having active circuitry which sinks current during the deselect sequence.

* * * * *

UNITED STATES PATENT AND TRADEMARK OFFICE
CERTIFICATE OF CORRECTION

PATENT NO. : 5,243,572
DATED : September 7, 1993
INVENTOR(S) : Hoshizaki et al

It is certified that error appears in the above-indentified patent and that said Letters Patent is hereby corrected as shown below:

In column 8, claim 1, line 43 delete "sequence,." and insert therefor --sequence,--.

Signed and Sealed this

Twenty-first Day of June, 1994

Attest:

BRUCE LEHMAN

Attesting Officer

Commissioner of Patents and Trademarks